(12) United States Patent
Ramalho et al.

(10) Patent No.: US 6,225,802 B1
(45) Date of Patent: May 1, 2001

(54) APPARATUS FOR AUTOMATIC MEASUREMENT OF RESISTANCE OF INTEGRATED MR DEVICE

(75) Inventors: Joao N. V. L. Ramalho, Biéville-Beuville (FR); Gerben W. De Jong; Jozef A. M. Ramaekers, both of Eindhoven (NL); Eric Pieraerts, Caen (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/356,596

(22) Filed: Jul. 19, 1999

(30) Foreign Application Priority Data

Jul. 17, 1998 (FR) .................................... 9809161

(51) Int. Cl.[7] ..................................... G01B 7/14
(52) U.S. Cl. ......................... 324/252; 324/207.21; 360/67
(58) Field of Search ................... 324/252, 607, 324/62, 692, 705, 713, 207.21, 307, 327; 360/113, 67

(56) References Cited

U.S. PATENT DOCUMENTS 4,160,949 * 7/1979 Mcfayden .............................. 324/62
4,703,378 * 10/1987 Imakoshi et al. .................... 360/113
5,327,303 * 7/1994 Smith .................................... 360/67

OTHER PUBLICATIONS

Hans W. Klein and Moises E. Robinson et al. A.8 nV/Hz CMOS Preamplifier for Magneto–Resistive Read Elements, 1994 IEEE, Solid state Circuit Conf. ISSCC94/14/Ampl./Paper FA 14.5 pp. 252–253.*

* cited by examiner

Primary Examiner—Christine Oda
Assistant Examiner—Subhashi Zaveri
(74) Attorney, Agent, or Firm—Bernard Franzblau

(57) ABSTRACT

A device for measuring the resistance of an MR element which passes a bias current Imr and which derives a bias voltage. A voltage comparator CMP receives the bias voltage Vmr and a reference voltage Vref. A counter UPCNT has an enable input EN coupled to the output of the comparator and a digital output forming the output of the device. A current source supplies the bias current Imr which represents a digital value received by the current source at its control input which is coupled to the digital output of the counter. The device enables the digital value of a resistance to be measured automatically.

16 Claims, 2 Drawing Sheets

APPARATUS FOR AUTOMATIC MEASUREMENT OF RESISTANCE OF INTEGRATED MR DEVICE

BACKGROUND OF THE INVENTION

This invention relates to a device for measuring the value of a resistance through which a bias current is to be passed and across which a bias voltage is to be generated.

The measurement methods used most frequently are based on the application of Ohm's law, in accordance with which the value of a resistance is equal to the quotient of the value of the voltage appearing across this resistance and the value of the current flowing through it. Therefore, it suffices to measure the bias current and voltage to derive the value of the resistance directly therefrom. Though such a method can be implemented comparatively easily for measuring the resistance of a discrete component, this method is ill-suited for measuring the resistance of a component integrated in a unit, which component may then not be accessible at all from the exterior of the unit. This is the case, for example, for the measurement of the quiescent resistance of a magnetoresistive bar integrated in a read head for reading magnetic information, during which measurement it is obviously out of the question to connect a voltmeter in parallel with the magnetoresistive bar and an ammeter in series with said bar. Moreover, if it is to be utilized, the measurement result, i.e. the value of the resistance, should be expressed in the form of an electric signal, which in many cases should take a digital form.

SUMMARY OF THE INVENTION

It is an object of the invention to meet these requirements by providing a device for measuring the value of a resistance wherein the measurement is carried out automatically within the device, without any external intervention, the result of said measurement being available directly in digital form.

To this end, according to the invention, a magnetic information reading device of the type defined in the opening paragraph is characterized in that it comprises:

- a voltage comparator having a first and a second input intended for to receiving, respectively, the bias voltage and a reference voltage, and having an output,
- count-up/count-down means having an enable input coupled to the output of the comparator, and having a digital output forming the output of the device, and
- a current source for suppling the bias current whose value represents a digital value received by said current source at a control input, said control input being coupled to the digital output of the count-up/count-down means.

The operation of this measurement device is based on the fact that its output signal defines the value of the bias current of the resistance. This current thus varies progressively until the bias voltage, generated by the resistance under the influence of the bias current, is equal to the value of the reference voltage. The count-up/count-down means are then deactivated and their output supplies a digital value representing the value of the resistance.

A variant of the invention provides a device for measuring the value of a resistance to be subjected to a bias voltage and for generating a bias current, which device is characterized in that it comprises:

- a current comparator, having a first and a second input, for receiving, respectively, a current representative of the bias current, and a reference signal, and having an output,
- count-up/count-down means having an enable input coupled to the output of the comparator, and having a digital output forming the output of the device, and
- a voltage source for suppling the bias voltage whose value represents a digital value received by the voltage source at a control input, said control input being coupled to the digital output of the count-up/count-down means.

In this variant of the invention the resistance is biased by means of the bias voltage and, under the influence of this voltage, generates the bias current, this being the object of a comparison with a reference signal. The output signal of the device determines the value of the bias voltage. This voltage thus varies progressively until the value of the bias current is equal to the value of the reference signal. The count-up/count-down means are then deactivated and their output supplies a digital value representing the value of the resistance.

Another variant of the invention provides a device for measuring the value of a resistance through which a bias current is to be passed and across which a bias voltage is to be generated, the values of the bias current and the bias voltage being controllable simultaneously by means of a module for controlling the power dissipated by the resistance, which device is characterized in that it comprises:

- a current multiplier for receiving a first current, a second current representative of the bias current, and a third current representative of the bias voltage, which multiplier is intended to generate a fourth current having a value proportional to the quotient of the values of the third current and the second current, multiplied by the value of the first current,
- a current comparator having a first input and a second input, respectively, for receiving the fourth current and a reference current, and having an output,
- count-up/count-down means having an enable input coupled to the output of the comparator, and having a digital output forming the output of the device, and
- a current source for suppling the first current whose value is representative of a digital value received by said current source at a control input, which control input is coupled to the digital output of the count-up/count-down means.

In this other variant of the invention, the values of the bias voltage and bias current are determined by the control module and cannot be influenced individually by the measurement device. Only the ratio between these two values is useful because it remains constant. The function of the current multiplier is thus to generate a signal representing this ratio, which signal is formed by the fourth current and is dependent on the first current, whose value is determined by the output of the device. The first current as well as the fourth current vary progressively until the value of said fourth current has become equal to the value of the reference signal. The count-up/count-down means are then deactivated and their output supplies a digital value representing the value of the resistance. The measurement devices described hereinbefore can be used advantageously in devices for reading magnetic information, having at least one read head comprising at least one magnetoresistive bar intended for generating data pulses which represent information read by the head.

Such reading devices are commonly used for reading information stored on hard disks for computers. These disks generally have a magnetosensitive surface which is to be scanned by the read head. A rotary movement is imparted to the disk, while the read head is coupled to an arm which imparts a radial movement to the head. The disk surface is divided into a multitude of sub-surfaces in which a local magnetic field exists whose sign represents an item of binary information.

The operation of customary reading devices is based on the fact that when a magnetoresistive bar is exposed to a magnetic field its resistance varies.

In the majority of existing magnetic information reading devices the magnetoresistive bar is biased either by means of a d.c. bias current of predetermined value which flows through said bar, in which case the resistance variation generates a voltage pulse, or by means of a d.c. bias voltage of predetermined value applied across said bar, in which case said resistance variation generates a current pulse.

In the two afore-mentioned cases the amplitude of the generated pulses, called data pulses, will be higher as the predetermined value is higher. Therefore, it may seem advantageous to choose the predetermined value as high as possible in order to obtain a signal-to-noise ratio which is as high as possible. However, the predetermined value also dictates the power to be dissipated by the magnetoresistive bar. Thus, a predetermined value which is too large may lead to premature wear of the magnetoresistive bar as a result of an excessive permanent dissipation owing to the Joule effect. Moreover, the high amplitude of the data pulses resulting from such a choice may cause the appearance of power pulses too high to be dissipated by the bar without damage and may lead to the destruction of the latter. Thus, the choice of the predetermined value appears to be a matter of a compromise between, on the one hand, an optimum signal-to-noise ratio for the data pulses and, on the other hand, a minimization of the wear and the risk of breakdown of the magnetoresistive bar, i.e. a minimization of the power dissipated by said bar.

In the present state of the art methods of selecting the predetermined value are used, which all make use of the value assumed by the resistance of the magnetoresistive bar when this bar is not exposed to any magnetic information. Indeed, this value, referred to as the quiescent resistance, is essential for calculating, on the one hand, the amplitude which the data pulses will have and, on the other hand, the power dissipated in the bar. Thus, the value of the quiescent resistance is considered to be indispensable for determining the best compromise in accordance with the principle expounded above.

However, the value of the quiescent resistance constitutes information which can be useful for other purposes than the mere biasing of the magnetoresistive bar. The quiescent resistance is, for example, representative of the condition of wear of the magnetoresistive bar. Thus, a substantial decrease of the value of the resistance of the magnetoresistive bar, detected by comparing the results of successive measurements carried out at regular intervals throughout the lifetime of the reading device, points towards a deterioration of said bar. This information can serve as a warning: the data stored in the surface to be scanned by the read head which incorporates the magnetoresistive bar can, by way of precaution, be transferred to another area of the disk or to another disk, access to the original area then being prohibited.

The invention also relates to a device for reading magnetic information, which device has at least one read head comprising at least one magnetoresistive bar for generating data pulses which represent information read by the head, characterized in that it further includes a device for measuring the digital value of the resistance of the magnetoresistive bar as described hereinbefore.

BRIEF DESCRIPTION OF THE DRAWINGS

The invention will be more fully understood with the aid of the following description, given by way of non-limitative example, with reference to the accompanying drawings, in which.

DESCRIPTION OF THE PREFERRED EMBODIMENTS

Figure 1:
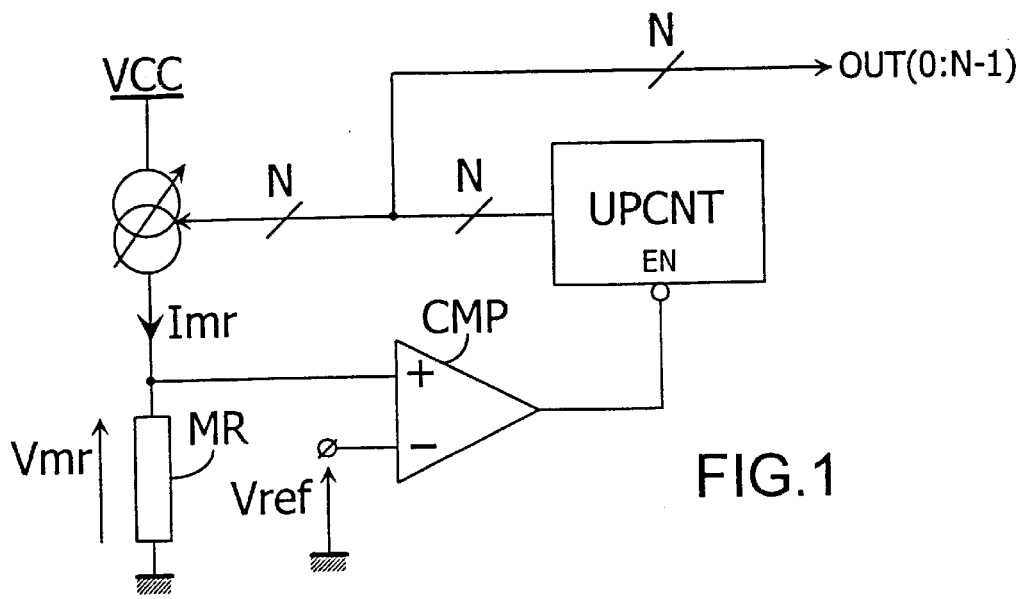
FIG. 1 is a partial functional diagram which represents a measurement device in accordance with the invention.

FIG. 1 is a functional diagram which represents a device for measuring the value of a resistance MR through which a bias current Imr is to be passed and across which a bias voltage Vmr is to be generated. This device comprises:

a voltage comparator CMP, having a first and a second input arranged to receive, respectively, the bias voltage Vmr and a reference voltage Vref of predetermined value, and having an output, count-up/count-down means UPCNT having an enable input EN coupled to the output of the comparator CMP, and having a digital output coded for N bits and forming the output of the device, and a current source adapted to supply the bias current Imr whose value represents a digital value OUT (O:N−1) received by said current source at a control input, which control input is coupled to the digital output of the count-up/count-down means UPCNT.

In the example described with reference to FIG. 1 the count-up/count-down means UPCNT are formed by an up-counter. However, they may likewise be formed by a down-counter adapted to be decremented starting from a preset count, in which case the inputs of the comparator are interchanged. The current source which supplies the bias current Imr can be implemented in numerous versions which are well-known to those skilled in the art. Furthermore, the resistance MR may be formed by the magnetoresistive bar of a read head for reading magnetic information, assuming one wishes to know the quiescent resistance of the MR bar. This device operates as follows: upon its energization the current source supplies a bias current Imr whose value is comparatively small, the output signal OUT (O:N−1) of the counter UPCNT being initially set to zero. The value of the bias voltage generated by the resistance MR is then smaller than the value of the reference voltage Vref. The output of the comparator CMP is then in a low state corresponding to a "logic 0" level, thus enabling the counter UPCNT to count. The digital value of the output signal OUT (O:N−1) of the counter UPCNT, which constitutes the output signal of the device, then increases progressively. The bias current Imr, which can be expressed as Imr=I0.VAL, where VAL= $(OUT_0+2.0UT_1+4.0UT_2+\ldots 2^i.OUT_i+\ldots 2^{N-1}.OUT_{N-1})$, and I0 is a known constant current, also increases until the value of the bias voltage Vmr has become equal to the reference voltage. The output of the comparator CMP then goes to a high state, thereby deactivating the counter UPCNT, which stores the last value of the output signal OUT (O:N−1). It is then possible to write: Rmr.Imr=Vref, where Rmr is the value of the resistance to be measured, or alternatively Rmr=Vref/(I0.VAL). The output signal of the device thus automatically provides a digital signal OUT (0:N–1) whose value VAL represents the value of the resistance Rmr to be measured.

Figure 2:
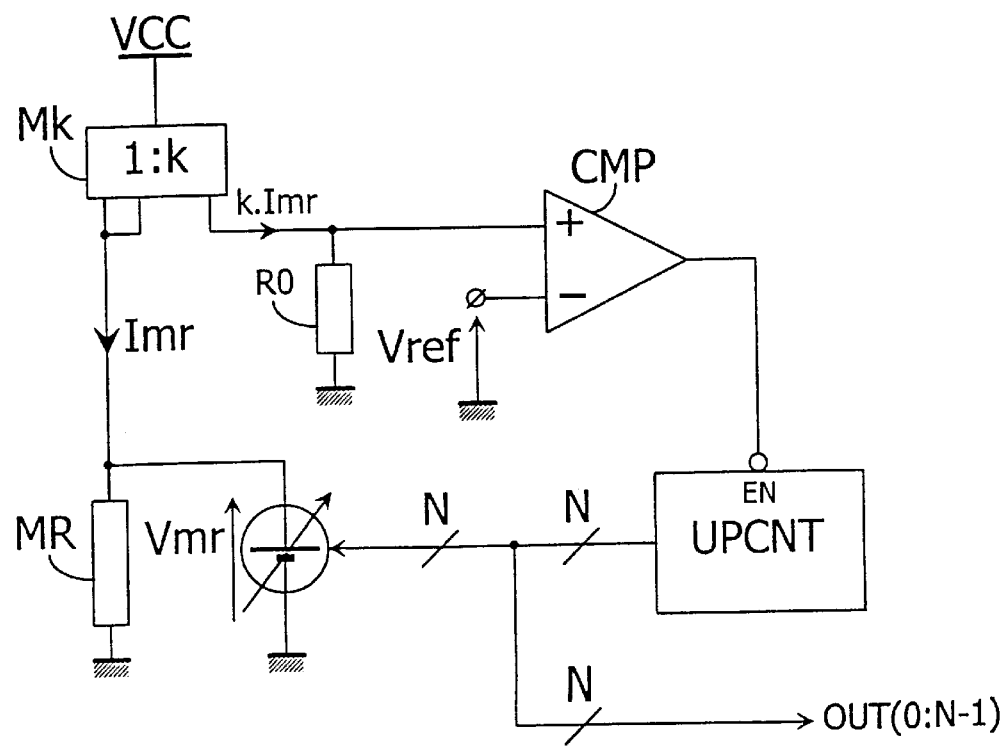
FIG. 2 is a partial functional diagram which represents a measurement device in accordance with a variant of the invention.

FIG. 2 represents a device for measuring the value of a resistance MR to be subjected to a bias voltage Vmr and to generate a bias current Imr. This device comprises:

- a comparator (Mk, R0, CMP), having a first and a second input for receiving, respectively, the bias current Imr and a reference signal, and having an output,
- count-up/count-down means UPCNT having an enable input coupled to the output of the comparator (Mk, R0, CMP), and having a digital output coded for N bits and forming the output of the device, and
- a voltage source adapted to supply the bias voltage Vmr whose value represents a digital value OUT (0:N–1) received by said voltage source on a control input, which control input is coupled to the digital output of the count-up/count-down means UPCNT.

In the example described with reference to FIG. 2, the count-up/count-down means UPCNT are formed by an up-counter. However, they may likewise be formed by a down-counter adapted to be decremented starting from a preset count, in which case the inputs of the comparator (Mk, R0, CMP) are interchanged. Furthermore, the resistance MR may be formed by the magnetoresistive bar of a read head for reading magnetic information, of which MR bar someone wishes to know its quiescent resistance. The comparator (Mk, R0, CMP) comprises a multiplying current mirror MK having a coefficient k and intended for reproducing the bias current Imr before supplying it to a voltage comparator CMP. The latter receives a reference voltage Vref on one input and receives a voltage on its other input, which voltage results from the product of the image of the bias current k.Imr and a known resistance of a predetermined value R0. Thus, this comparator has a switching threshold whose value is $Imr_{th}=Vref/(k.R0)$. The voltage source which supplies the bias voltage Vmr can be implemented in numerous versions which are well-known to those skilled in the art. This device operates as follows: upon its energization the voltage source supplies a bias voltage Vmr whose value is comparatively low, the output signal OUT (0:N–1) of the counter UPCNT being initially set to zero. The value of the bias current Imr generated by the resistance MR is then smaller than the switching threshold $Imr_{th}$. The output of the comparator CMP is then in a low state corresponding to a "logic 0" level, thus enabling the counter UPCNT to count. The digital value of the output signal OUT (0:N–1) of the counter UPCNT, which constitutes the output signal of the device, then increases progressively. The bias voltage Vmr, which can be expressed as Vmr =V0.VAL, where $VAL=(OUT_0+2.0UT_1+4.OUT_2+ \ldots 2^i.OUT_i+ \ldots 2^{N-1}.OUT_{N-1})$, and V0 is a known constant voltage, also increases until the value of the bias current Imr has become equal to that of the switching threshold $Imr_{th}$ of the comparator (Mk, R0, CMP). The output of the comparator (Mk, R0, CMP) then goes to a high state, thereby deactivating the counter UPCNT, which stores the last value of the output signal OUT (0:N–1). It is then possible to write: Imr=Vmr/Rmr=Vref/(k.R0), where Rmr is the value of the resistance to be measured, or alternatively Rmr=VAL.(k.R0.V0)Vref. The output signal of the device thus automatically provides a digital signal OUT (0:N–1) whose value VAL represents the value of the resistance Rmr to be measured.

Figure 3:
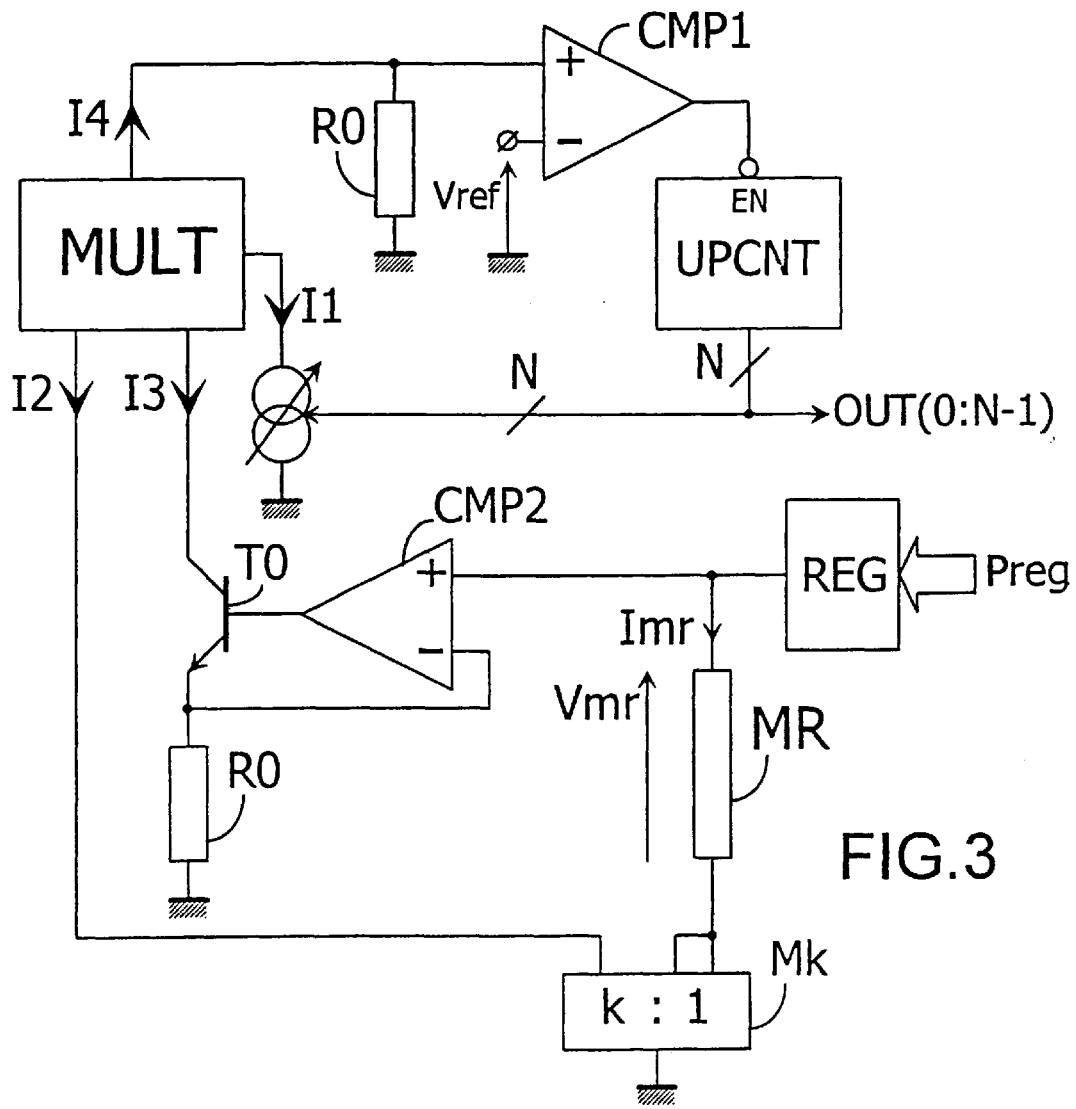
FIG. 3 is a partial functional diagram which represents a measurement device in accordance with another variant of the invention.

FIG. 3 represents a device for measuring the value of a resistance MR through which a bias current Imr is to be passed and across which a bias voltage Vmr is to be produced, the values of the bias current Imr and the bias voltage Vmr being controllable simultaneously by means of a module REG for controlling the power dissipated by the resistance MR. This device comprises:

- a current multiplier MULT for receiving a first current I1, a second current I2 representing the bias current Imr, and a third current I3 representing the bias voltage Vmr, which multiplier MULT serves for generating a fourth current I4 having a value proportional to the quotient of the values of the third current I3 and the second current I2, multiplied by the value of the first current I1,
- a comparator (R0, CMP1) having a first input and a second input, respectively arranged to receive the fourth current I4 and a referencesignal, and having an output,
- count-up/count-down means UPCNT having an enable input EN coupled to the output of the comparator (R0, CMP1), and having a digital output forming the output of the device, and
- a current source for supplying the first current I1 whose value represents a digital value OUT (0:N–1) received by said current source at a control input. The control input is coupled to the digital output of the count-up/count-down means UPCNT.

In the example described with reference to FIG. 3, the count-up/count-down means UPCNT are formed by an up-counter. However, they may likewise be formed by a down-counter which is to be decremented starting from a preset count, in which case the inputs of the comparator (R0, CMP1) are interchanged. Furthermore, the resistance MR may be formed by the magnetoresistive bar of a read head for reading magnetic information, of which bar one wishes to know its quiescent resistance. The comparator (R0, CMP1) comprises a first voltage comparator CMP1. The latter receives a reference voltage Vref on one input and receives on its other input a voltage which results from the product of the fourth current I4 and a known resistance of a predetermined value R0. Thus, this current comparator has a switching threshold whose value is $I4_{th}=Vref/R0$. The current source which supplies the bias current Imr can be implemented in numerous versions which are well-known to those skilled in the art.

In the variant of the invention described with reference to FIG. 3, the values of the bias voltage Vmr and the bias current Imr are determined by the value of a set-point signal Preg, which defines the power to be dissipated by the resistance MR and which is obtained from outside of the control module REG. Thus, the values of the bias voltage Vmr and the bias current Imr cannot be influenced individually by the measurement device. Only the ratio Vmr/Imr between these two values is useful because it remains constant. The function of the current multiplier MULT is thus to generate a signal representing this ratio. This signal is formed by the fourth current I4 and is dependent on the first current I1, whose value is determined by the output of the device. The second current I2 is the reproduction of the bias current Imr and is obtained via a current mirror Mk which multiplies Imr by a coefficient k, yielding: I2=k.Imr. The third current I3 is proportional to the bias voltage Vmr: $I3=k'.Vmr/R0$, the value of the constant k' being dependent on the gain factors of a second comparator CMP2 and of a transistor T0, which are used for generating the third current I3 in accordance with a technique which is well-known to those skilled in the art. The value of the fourth current I4 is proportional to the quotient of the third current I3 and the second current I2, multiplied by the value of the first current I1, which is written as I4=k".I1.I3/I2. Substitution of the values for the second and the third current I2 and I3 in the last expression yields I4=k'.k".(I1Vmr.)/(k.R0.Imr). According to Ohm's law, Rmr=Vmr/Imr, so that I4=k'.k".(I1/Rmr)/(k.R0) or I4=K.I1.Rmr/R0, where K is a multiplying constant which integrates the constants k, k' and k".

This device operates as follows: upon its energization the current source supplies a first current Imr whose value is comparatively small, the output signal OUT (O:N−1) of the counter UPCNT being initially set to zero. The value of the fourth current I4 generated by the current multiplier MULT is then smaller than the switching threshold $I4_{th}$. The output of the first comparator CMP1 is then in a low state corresponding to a "logic 0" level, thus enabling the counter UPCNT to count. The digital value of the output signal OUT (O:N−1) of the counter UPCNT, which constitutes the output signal of the device, then increases progressively. The value of the first current, which can be expressed as I1=I0.VAL, where VAL=($OUT_0$+2.$OUT_1$+4.$OUT_2$+. . . $2^i.OUT_i$+. . . $2^{N-1}.OUT_{N-1}$), and I0 is a known constant current, also increases until the value of the fourth current I4 has become equal to that of the switching threshold $I4_{th}$ of the comparator (R0, CMP1). The output of the first voltage comparator CMP1 then goes to a high state, thereby deactivating the counter UPCNT, which stores the last value of the output signal OUT (O:N−1). It is then possible to write: I4=K.I1.Rmr/R0=Vref/R0, where Rmr is the value of the resistance to be measured, or alternatively Rmr=Vref/(K.I1), or Rmr=Vref/(K.I0.VAL). The output signal of the device thus automatically provides a digital signal OUT (O:N−1) whose value VAL represents the value of the resistance Rmr to be measured.

Figure 4:
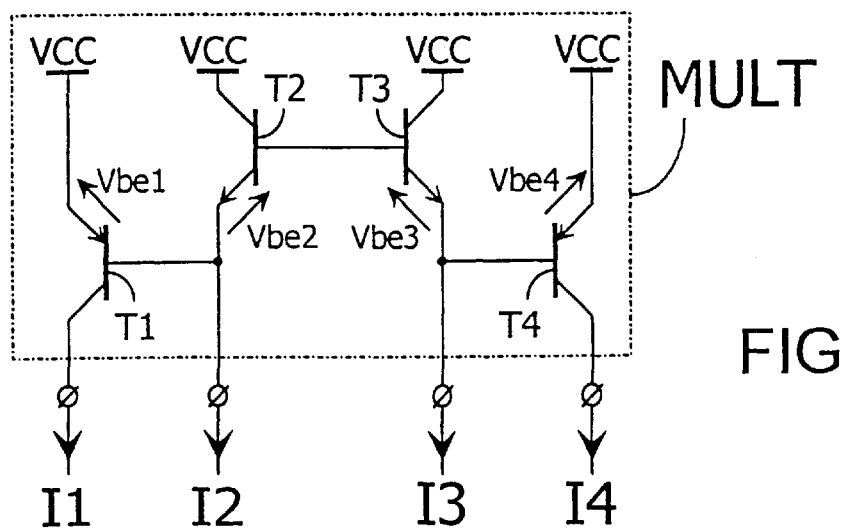
FIG. 4 is an electrical diagram which represents a current multiplier included in this measurement device.

FIG. 4 is an electrical diagram which shows a variant of the current multiplier MULT. It is evident that other variants exist and are conceivable to those skilled in the art. In the present variant, the multiplier MULT comprises:

- a first and a fourth transistor T1 and T4 of the PNP type, having their collectors arranged to allow, respectively, the first and the fourth current I1 and I4 to pass through and having their emitters coupled to a positive supply terminal VCC,
- a second and a third transistor T2 and T3 of the NPN type, having their bases coupled together, having their collectors coupled to the positive supply terminal VCC, having their emitters coupled, respectively, to the bases of the first and the fourth transistor T1 and T4, which emitters are arranged to allow, respectively, the second and the third current I2 and I3 to pass through.

The operation of the multiplier MULT is based on the following equations: On the one hand, ΣVbei=0, where Vbei is the base-emitter voltage of the transistor Ti and, on the other hand, Vbei=$V_T$.ln(Ici/Ios), where $V_T$ is equal to the product of Boltzmann's constant and the absolute temperature, by which the elementary charge is divided, Ici being the collector current of the transistor Ti and Ios being a constant current whose value is related directly to the area of the transistor Ti. Since the transistors forming the multiplier MULT have substantially equal dimensions and the second and the third current I2 and I3 are equal to k.Imr and k'.Vmr/R0, respectively, the expert can readily express the fourth current I4 as I4=K1'.(I1.Vmr)/(R0.Imr), or I4=K1.I1.Rmr/R0because Vmr=Rmr.Imr, K1 integrating the constants k and k'.

What is claimed is:

1. A device for measuring the value of a resistance through which a bias current is to be passed and across which a bias voltage is to be generated, which device comprises:

a voltage comparator having a first and a second input for receiving, respectively, the bias voltage and a reference voltage, and having an output, count-up/count-down means having an enable input coupled to the output of the comparator, and having a digital output forming the output of the device, and a current source for supplying the bias current whose value represents a digital value received by said current source at a control input, said control input being coupled to the digital output of the count-up/count-down means.

2. A device for measuring the value of a resistance to be subjected to a bias voltage and intended for generating a bias current, which device comprises:

a current comparator, having a first and a second input, for receiving, respectively, a current representative of the bias current, and a reference signal, and having an output, count-up/count-down means having an enable input coupled to the output of the comparator, and having a digital output forming the output of the device, and a voltage source for supplying the bias voltage whose value represents a digital value received by the voltage source on a control input, said control input being coupled to the digital output of the count-up/count-down means.

3. A device for measuring the value of a resistance through which a bias current is to be passed and across which a bias voltage is to be generated, the values of the bias current and the bias voltage being controllable simultaneously by means of a module for controlling the power dissipated by the resistance, which device comprises:

a current multiplier for receiving a first current, a second current representative of the bias current, and a third current representative of the bias voltage, said multiplier generating a fourth current having a value proportional to the quotient of the values of the third current and the second current, multiplied by the value of the first current, a current comparator having a first input and a second input, respectively receiving the fourth current and a reference signal, and having an output, count-up/count-down means having an enable input coupled to the output of the current comparator, and having a digital output forming the output of the device, and a current source for supplying the first current whose value is representative of a digital value received by said current source on a control input, which control input is coupled to the digital output of the count-up/count-down means.

4. A device for reading magnetic information, which device has at least one read head comprising at least one magnetoresistive bar for generating data pulses which are representative of information read by the head, and a device as claimed in claim 1 for measuring the digital value of the resistance of the magnetoresistive bar.

5. A device for measuring the resistance of a resistive element, comprising:

means for deriving a bias voltage across the resistive element, a comparator having a first input for receiving a control voltage determined by the bias voltage, a second input for receiving a reference voltage, and an output, a counter having an input coupled to the output of the comparator and an output for deriving a digital output of the resistance measuring device, and wherein the bias voltage deriving means has a control input coupled to the digital output of the counter thereby to adjust the bias voltage to a value which represents a digital value of the resistance of the resistive element.

6. A resistance measuring device as claimed in claim 5 wherein the comparator is a voltage comparator and said bias voltage deriving means comprises a variable current source having the control input coupled to the output of the counter thereby to supply a bias current to the resistive element of a value determined by the digital count at the output of the counter.

7. A resistance measuring device as claimed in claim 6 wherein the input of the counter is an enable input which allows the counter to count until the control voltage is equal to the reference voltage at the second input of the comparator.

8. A resistance measuring device as claimed in claim 6 wherein the current source is connected in series with the resistive element to a source of supply voltage.

9. A resistance measuring device as claimed in claim 5 wherein the bias voltage deriving means comprises a variable voltage device having the control input coupled to the output of the counter so that the bias voltage has a value determined by the digital count at the output of the counter.

10. A resistance measuring device as claimed in claim 9 wherein the bias voltage deriving means further comprises;

a current mirror having a first output connected to the resistive element, a second output coupled to a reference resistor coupled in turn to the first input of the comparator, and an input coupled to a source of supply voltage.

11. A resistance measuring device as claimed in claim 9 wherein the input of the counter is an enable input which allows the counter to count until the control voltage is equal to the reference voltage at the second input of the comparator.

12. A resistance measuring device as claimed in claim 5 in which a bias current flows through the resistive element and across which a bias voltage is generated, the measuring device further comprising means for controlling the power dissipated by the resistive element so as to simultaneously control the values of the bias current and the bias voltage.

13. A resistance measuring device as claimed in claim 5 further comprising:

a current multiplier for receiving a first current, a second current representative of the bias current, and a third current representative of the bias voltage, said multiplier generating a fourth current having a value proportional to the quotient of the values of the third current and the second current, multiplied by the value of the first current, said comparator first input receiving the control voltage which is determined by the fourth current, and a variable current source coupled to the multiplier for control of the value of the first current and having a control input coupled to the digital output of the counter so that the value of said first current represents the digital output of the counter.

14. A resistance measuring device as claimed in claim 5 wherein said resistive element is a magnetoresistive element of a magnetic read head for reading magnetic data from a movable magnetic information apparatus.

15. A resistance measuring device as claimed in claim 12 wherein said power controlling means comprises a current multiplier having an output coupled to the first input of the comparator and arranged to supply at its output a current determined by the ratio of the bias voltage to the bias current (Vmr/Imr).

16. A resistance measuring device as claimed in claim 15 wherein the output current of the current multiplier is further determined by a first current supplied to the multiplier by a current source controlled by the digital output of the counter.

* * * * *

Disclaimer 6,225,802—Joao N.V.L. Ramalho, Biéville-Beuville (FR); Gerben W. De Jong; Jozef A. M. Ramaekers, both of Eindhoven (NL); Eric Pieraerts, Caen (FR). APPARATUS FOR AUTOMATIC MEASUREMENT OF RESISTANCE OF INTEGRATED MR DEVICE. Patent dated May 1, 2001. Disclaimer filed June 24, 2008, by the assignee, U.S. Philips Corporation.

Hereby disclaims all of the claims of said patent.

(*Official Gazette September 30, 2008*)